United States Patent [19]
Lau et al.

[11] Patent Number: 4,828,961
[45] Date of Patent: May 9, 1989

[54] IMAGING PROCESS FOR FORMING CERAMIC ELECTRONIC CIRCUITS

[75] Inventors: John W. Lau, Gaithersburg; Kevin E. Bennet, Chevy Chase, both of Md.

[73] Assignee: W. R. Grace & Co.-Conn., New York, N.Y.

[21] Appl. No.: 881,421

[22] Filed: Jul. 2, 1986

[51] Int. Cl.$^4$ .......................... G03C 3/00; G03C 5/00; B44C 1/22
[52] U.S. Cl. ..................................... 430/198; 156/89; 430/311; 430/312; 430/330
[58] Field of Search ............. 156/89; 29/25.41, 25.42; 430/198, 312, 317, 330, 288, 11, 15; 264/61, 62

[56] References Cited

U.S. PATENT DOCUMENTS

| | | | |
|---|---|---|---|
| 3,189,978 | 6/1965 | Stetson | 29/155.5 |
| 3,549,784 | 12/1970 | Hargis | 174/68.5 |
| 3,914,128 | 10/1975 | Scheiber | 430/288 |
| 3,978,248 | 8/1976 | Usami | 427/96 |
| 4,336,320 | 6/1982 | Cummings et al. | 430/198 |
| 4,422,914 | 12/1983 | Tsao et al. | 204/159.19 |
| 4,540,462 | 9/1985 | Mizunoya et al. | 156/630 |
| 4,555,285 | 11/1985 | Chance | 156/89 |
| 4,586,972 | 5/1986 | Yokotani | 156/89 |

FOREIGN PATENT DOCUMENTS 1256344 12/1971 United Kingdom .

OTHER PUBLICATIONS

"Tape Casting of Ceramics"; *Ceramic Processing Before Firing*; Onoda & Hench; J. Wiley; 1978; pp. 411-449.
"Substrates for Thick Film Circuits"; *Handbook of Thick Film Hybrid Microelectronics*; Harper; McGraw-Hill; 1982; pp. 4-1 to 4-3, 5-4 to 5-5.
"Properties of Glass"; *Glass Engineering Handbook*; 3rd Ed; McLellan and Shand; pp. 2-1 to 2-7.
"Design Considerations"; *Handbook of Materials and Processes for Electronics*; Harper; McGraw-Hill; pp. 14-119 to 14-120.
"The Present Quality of Ceramic Electrical Insulators"; Electronic Ceramics-A Continuing Education Symposium; Rigterink; 1969.
CRC Handbook of Chemistry and Physics; Weast; 65th Ed. pp. B-14, B-18, B-19, B-35.

Primary Examiner—Michael W. Ball
Assistant Examiner—J. Davis
Attorney, Agent, or Firm—Edward J. Cabic

[57] ABSTRACT

Electronic circuits are made with a ceramic body and electrical components which can be disposed in different layers. Interconnecting means can be provided which are disposed entirely within the body. The ceramic body and the electrical components are sintered to form a monolithic structure in a single firing. The electrical components are formed in layers by mixing the electrical component in a sinterable form with a radiation sensitive material which serves as a binder. After exposure to radiation in the desired pattern the layer is developed to form the desired pattern. Multiple patterns can be formed prior to firing.

17 Claims, 3 Drawing Sheets

IMAGING PROCESS FOR FORMING CERAMIC ELECTRONIC CIRCUITS

BACKGROUND OF THE INVENTION

1. Field of the Invention

This invention relates to improved electronic circuits and the methods of manufacture.

2. Description of the Previously Published Art

The manufacture of various types of single and multi-layer ceramic electronic packages is generally known. Several methods are embraced, for example, U.S. Pat. No. 3,189,978 teaches a method of screen printing conductive layers of desired patterns on the surfaces of green ceramic sheets which are formed separately. Desired electrical interconnections between layers of green ceramic sheets are formed by punching holes (vias) in the green ceramic sheets, and the respective holes are filled with conductive material. The resultant sheets are stacked into a laminated body so that the conductive layers may have the desired interconnections. The laminated body is sintered to obtain a multilayer structure.

Such prior art used relatively thick green ceramic sheets thus increasing the probability of the holes for interconnections not fully filled with conductive material. This results in the disconnection among conductive layers formed on the different sheets.

In U.S. Pat. No. 3,549,784 a method of screen printing insulative and conductive material alternatively on a ceramic body is described. The problem with this procedure is the deformation of the final ceramic structure because of differences of the shrinkage rates among the ceramic base, the ceramic and the metallic pastes during sintering. In order to avoid such deformation, the art proposes that on the reverse of the ceramic base a metallic layer is to be applied which has an area and thickness similar to the metallic layer or layers printed on the first side of the ceramic base. These additional printing steps result in an increase in manufacturing cost and an increase in the thickness of the final ceramic structure. The resolution and registration of screen printing techniques also limit the number of layers that can be formed.

In U.S. Pat. No. 3,978,248 the ceramic paste and metal paste for screen printing upon the green substrate are developed to exhibit the same shrinkage upon sintering.

Other processes for forming conductive circuit patterns on or within ceramic substrates have been proposed. U.S. Pat. No. 4,540,462 teaches a method wherein a metal sheet is bonded to one or both surfaces of a ceramic sheet. A circuit pattern is formed by coating a photopolymer layer onto the metal layer which is subsequently imaged and developed using conventional imaging and etching techniques. This process is restricted to a maximum of two conductive circuitry layers.

British Pat. No. 1,256,344 teaches a method of making electrical circuits by imaging of a photosensitive composition containing a metal or a heat fusible dielectric on a substrate. The composition is fired after each imaging process to burn off the photosensitive material and to fuse the composition to the substrate. This process has the disadvantage of requiring multiple firings and suffers from distortion due to differential shrinkage between the fired and unfired materials and distortion due to repeated firing.

U.S. Pat. No. 4,336,320 teaches a method for producing cofired conductor and dielectric patterns by depositing a photoresist layer over a dried dielectric thick-film paste. The photoresist is exposed through a photomask and the desired pattern is developed by a process which simultaneously etches the unfired dielectric layer. The resulting voids in the dielectric layer are mechanically filled with a conventional conductive paste not containing photosensitive materials. In another embodiment the dielectric composition contains photosensitive vehicle which can be imaged and developed directly. Again, the resultant voids in the dielectric layer are mechanically filled with a conductive paste not containing photosensitive materials. The patent is dependent upon a stenciling step where the conductive material is pressed or otherwise mechanically filling voids in the dielectric with a conductive paste. Although a key feature is a reduction in the number of firings, this process still requires multiple firings for fabricating multilayer structures. Furthermore, differential sintering shrinkage between the fired and unfired materials could lead to distortions.

OBJECTS OF THE INVENTION

It is an object of this invention to provide improved electronic circuitry with decreased dimensions.

It is a further object of this invention to provide miniaturized multilayer circuits having a relatively high degree of durability.

It is a further object of this invention to provide improved multilayer ceramic circuits.

It is a further object of this invention to provide the capability to produce thin layers of dielectric materials and conductive materials which allow the formation of other electrical components such as resistors, inductors and capacitors.

It is a further object of this invention to provide the capability to control conductor and dielectric thickness to provide greater thicknesses for improved conductivity or insulation if required.

It is a further object of this invention to produce fine features of conductors and dielectrics which provide improved packaging density and component density.

It is a further object of this invention to provide a process which dispenses with the mechanical tooling requirements of conventional technology which reduces cost and decreases set-up time.

It is a further object of this invention to provide high-resolution, repeatable registration of conductors and dielectrics which provides improved yield, higher quality and leads to higher performance.

It is a further object of this invention to produce special features such as co-axial conductors which improve reliability of operation and reduces electrical noise.

It is a further object of this invention to provide greater integration of CAD/CAM compatability by directly increasing the automation of the circuit construction process.

It is a further object of this invention to provide large area production of circuitry outside the conventional limits of tape casting and screen printing.

It is a further object of this invention to allow the construction of electrical components in a monolithic structure in a single firing.

These and additional objects will become apparent as the description of the invention proceeds.

SUMMARY OF THE INVENTION

The present invention relates to a method of making a structure of conductors and insulators which have a distribution of electrical elements, such as conductors, inductors, resistors and capacitor elements and which is capable of exhibiting electrical interconnections. A layer of a composition made of a sinterable material and a radiation sensitive material which serves as a binder for the sinterable material is applied on a sinterable support or a removable support. The sinterable material can be an insulator or a conductor. The layer is exposed to radiation in a desired pattern. The exposed composition layer is developed by removing areas not forming the desired pattern. Then the composite product is sintered in a single firing process to form a monolithic structure. As indicated above, the support can be removable so that it does not form part of the fired structure or the support can be a sinterable layer which will form part of the final fired structure.

When a multipattern structure is desired the method described above according to the present invention can be used. After developing the first layer at least one additional pattern is formed by repeating the basic steps of applying the layer, exposing to a pattern of radiation and developing to form a composite product. After the desired number of patterns are made a single, final firing is performed.

In another embodiment a multipattern structure of conductors and insulators having an internal distribution of electrical elements such as conductor, inductor, resistor and capacitor elements capable of exhibiting multilayer electrical interconnections is produced by a lamination technique. A series of sinterable supports are used and various single patterns are placed on each support and developed by the process of this invention. Then the various patterns on the supports are laminated together to form a composite product with a single final firing after forming the laminate. Alternatively the patterns can be made on removable supports with the supports removed prior to lamination. In this laminating technique the structure can be made to contain vias for the electrical interconnection between adjacent support layers.

DESCRIPTION OF THE PREFERRED EMBODIMENTS

Figure 1:
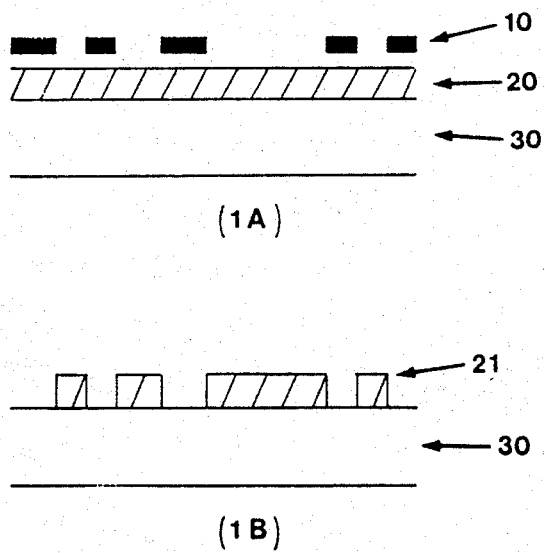
FIG. 1 is a schematic representation showing the basic components in depositing a pattern on a support.

The present invention is directed at producing either a single layer or multilayer composite structure comprising a plurality of conductive and insulative layers by radiation curing of compositions comprising radiation sensitive materials and sinterable materials followed by a single firing step to consolidate the structure into monolithic form. The sinterable materials can be either conductors or insulators.

In one embodiment a single layer structure is made. By loading ceramic and metal particulates in a radiation curable polymer, which serves as a binder for the particulates, such a composition can be formulated to be applied to a ceramic substrate for subsequent imaging, developing and sintering. An electronic package can then be obtained characterized by a range of dielectric constants imparted to it by the ceramic particulates and by a range of resistivities imparted to it by the metallic particulates.

Materials suitable for the dielectric particulates include, but are by no means limited to, alumina, beryllia, silicates, titanates, other oxides, aluminum nitride, and other nitrides and carbides. Materials suitable for the conductive particulates include, but are not limited to, metals such as molybdenum, silver, gold, copper, and platinum group metals as well as compounds such as ruthenium dioxide or tin oxide, or carbides.

Various types of radiation curable polymers can be used. See for example "UV Curing: Science & Technology", edited by S. P. Pappas, Technology Marketing Corp. (1980). Many types of radiation are contemplated for imaging and scanning to produce patterns and they can include, for example, UV, EB, IR, X-rays and lasers. Examples of ultraviolet light curable polymers are acrylates, methacrylates and cinnamate systems.

It is understood by those skilled in the art that the selection of the appropriate photopolymer is dependent upon the curing conditions (time, temperature, exposure to selected radiation, loading, etc), the firing conditions (rate of temperature increase, atmosphere, dwell time, peak temperature, etc.). An example of an ultraviolet light curable polymer is ACCUTRACE 3000 made by W. R. Grace & Co. The type of polymer is described in U.S. Pat. No. 4,422,914 and the entire content of this patent is incorporated herein by reference. The polymer has a urethane structure with terminal unsaturation and a terminal carboxylic group. The polymer can be loaded in one case with a ceramic particulate such as alumina powder to make an insulator or in another case with a metal powder such as molybdenum to make a conductor. These compositions are formulated and applied by photo-imaging techniques to unfired ceramic substrates. Patterns with less than 1 mil line and spacing can be generated with this system.

Some curable polymers may leave a carbon residue when the loaded compositions are sintered in a reducing atmosphere to fuse the sinterable material. If a dielectric is being made, for example, then this conductive carbon may be objectionable. In this event the firing can be carried out in an atmosphere conducive to the removal of carbon, e.g. an oxidizing atmosphere or a cleanly decomposing polymer system can be utilized. If thick sections need to be cured, changes can be made in the polymer system, the polymerization initiator system as well as in the radiation to give selective penetration.

In another embodiment multi-pattern composite structures can also be successfully fabricated.

These embodiments will be described with reference to FIGS. 1, 2 and 3.

FIG. 1 is an illustration of the basic steps in fabricating a conductive pattern on a support. The support can be a removable support or a sinterable support. Referring to FIG. 1A, a metal loaded photo-sensitive polymer composition 20 is applied in the form of a coating on a substantially continuous support 30. The composition is exposed to UV radiation through a photomask 10. After appropriate development by techniques well known in the art, the desired pattern 21 which is a negative image of the photomask 10 is formed on the support as shown in FIG. 1B. The photo-sensitive polymer as illustrated in FIG. 1 is a negative type photopolymer. It is understood by those skilled in the art of imaging with photo-sensitive polymers that either a positive or a negative photo-material could be used and that the method of developing the image will vary according to the photo-sensitive polymer being used.

In a preferred embodiment a metal powder such as molybdenum metal powder can be mixed with the preferred ACCUTRACE 3000 photopolymer in a preferred weight ratio of about 72:28 under low UV lighting conditions. The blended mixture is doctor blade coated to a thickness of about 1-2 mils upon an unfired ceramic substrate which was prepared according to conventional tape casting methods. See, for example, "Tape Casting of Ceramics" by R. E. Mistler, D. J. Shanefield and R. B. Runk at pages 411-448 in "Ceramic Processing Before Firing", edit. by G. Y. Onoda and L. L. Hench, J. Wiley & Son (1978). The coated substrate is positioned, without contact, under a photomask. The coated substrate is illuminated with colluminated UV light (from a high pressure mercury arc lamp) through the photomask for about 30 seconds. The exposed coated substrate is developed in an aqueous sodium carbonate solution such as a 0.75 weight percent solution. The developed pattern is subsequently rinsed, dried and post cured to enhance the integrity of the pattern. The patterned substrate is cofired in a reducing atmosphere at 1600° C. to sinter the metallic pattern and ceramic support.

Figure 2:
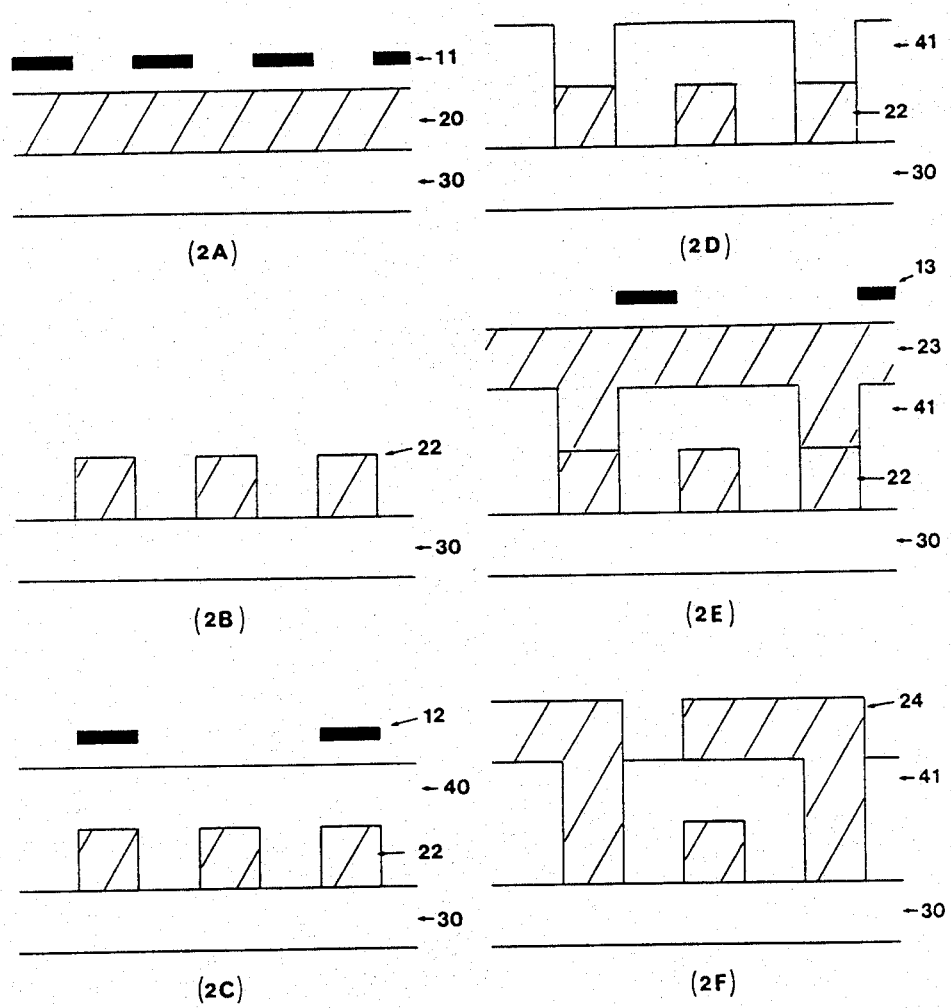
FIG. 2 is a schematic representation showing the basic steps in building a multi-pattern structure on a support.

FIG. 2 is an illustration of the basic steps in fabricating a multi-pattern structure. Referring to FIG. 2A, a metal loaded photo-sensitive polymer composition 20 is applied in the form of a coating on a support 30. The composition is exposed to UV radiation through a photomask 11. After appropriate development as shown in FIG. 2B, the desired pattern 22 which is a negative image of the photomask 11 is formed on the support. To build a multi-patterned structure, a second layer of loaded photopolymer 40 which in this case can be a dielectric composition is applied over the previously patterned substrate and is imaged as described above utilizing photomask 12 as shown in FIG. 2C. The resulting structure 41 shown in FIG. 2D is obtained after development of the second loaded photopolymer layer 40.

This coating, imaging and developing procedure can be repeated as shown in FIGS. 2E and 2F to create three dimensional patterned structures. Note that in FIG. 2E the layer of material designated 23 to make the next pattern 24 does not necessarily have to be formed in a horizontal plane; the layer can be arranged to make a 3 dimensional pattern structure.

The support 30 as illustrated in FIG. 2 can be a removable or sinterable support.

As an example of this multi-pattern embodiment a conductor polymer composition was made by mixing molybdenum metal powder with ACCUTRACE 3000 in the weight ratio of 72:28 under low UV lighting conditions. An additional mixture was prepared by mixing alumina powder with ACCUTRACE 3000 in the weight ratio of 73:27 under similar conditions. The blended alumina mixture was doctor blade coated to a thickness of 3-5 mils upon a removable Mylar substrate. This first layer was flooded with UV light to polymerize the photopolymer resulting in a continuous dielectric layer.

The metal loaded photopolymer was doctor bladed to a thickness of 1-2 mils. The coated substrate was positioned, without contact, under a photomask. The coated substrate was illuminated with colluminated UV light (from a high pressure mercury arc lamp) through the photomask for 30 seconds. The exposed coated substrate was developed in an aqueous sodium carbonate solution generating a second layer. The developed pattern was subsequently rinsed, dried and post cured to enhance the integrity of the pattern.

A third layer was produced by doctor blading alumina loaded photopolymer to a thickness of 3-5 mils above the previously patterned layer. A similar imaging and developing procedure was followed generating a three dimensional structure. The dielectric pattern was chosen to contain vias to provide interconnection to the fourth layer which was generated using the metal photopolymer material. The multiple patterned substrate was cofired in a reducing atmosphere at 1600° C. to sinter the metallic pattern and ceramic support. The result of this single firing was a monolithic substrate demonstrating integrity of the insulative and conductive structure, and more specifically, the fine dimension and electrical continuity of the conductive network.

This technical approach of using photo tools allows the production of finer detail than conventional screen printing and more accurate registration of multiple layers. Conventional screen printers are limited to a relatively small area in which accurate printing can be accomplished. The present technology for photoimaging allows the production of large areas with high resolution and registration which has been demonstrated up to 18 by 24 inches on a production basis.

The processes produce high accuracy sequential patterns of materials which can be of variable conductivity or insulators with variable dielectric constants. Thus sophisticated electrical components such as capacitors, co-axial conductors, resistors, etc. can be constructed which may be enclosed within the finished body.

The photoimaging process allows the production of complex structures without mechanical tools. By utilization of photomasks, structures such as vias, which are vertical conductor paths, solder pads and other such structures can be created. This elimination of mechanical tools allows for the rapid changeover from one product to another and it allows modifications to be easily accomplished and for engineering change orders to be rapidly instituted.

The active radiation generating the desired pattern can be from conventional UV light sources such as high pressure mercury or xenon lamps. However, the use of scanned lasers, electron beams or X-rays for example can also serve the same imaging purpose without the use of a photomask. The use of photomasks or these other sources of scanned radiation allows this process to be effectively controlled by CAD/CAM systems. This computer control allows even more effective utilization of the invention in creating more complex structures on an even more timely basis. This system can be fully automated and enclosed in a compact area providing improved product yields.

Figure 3:
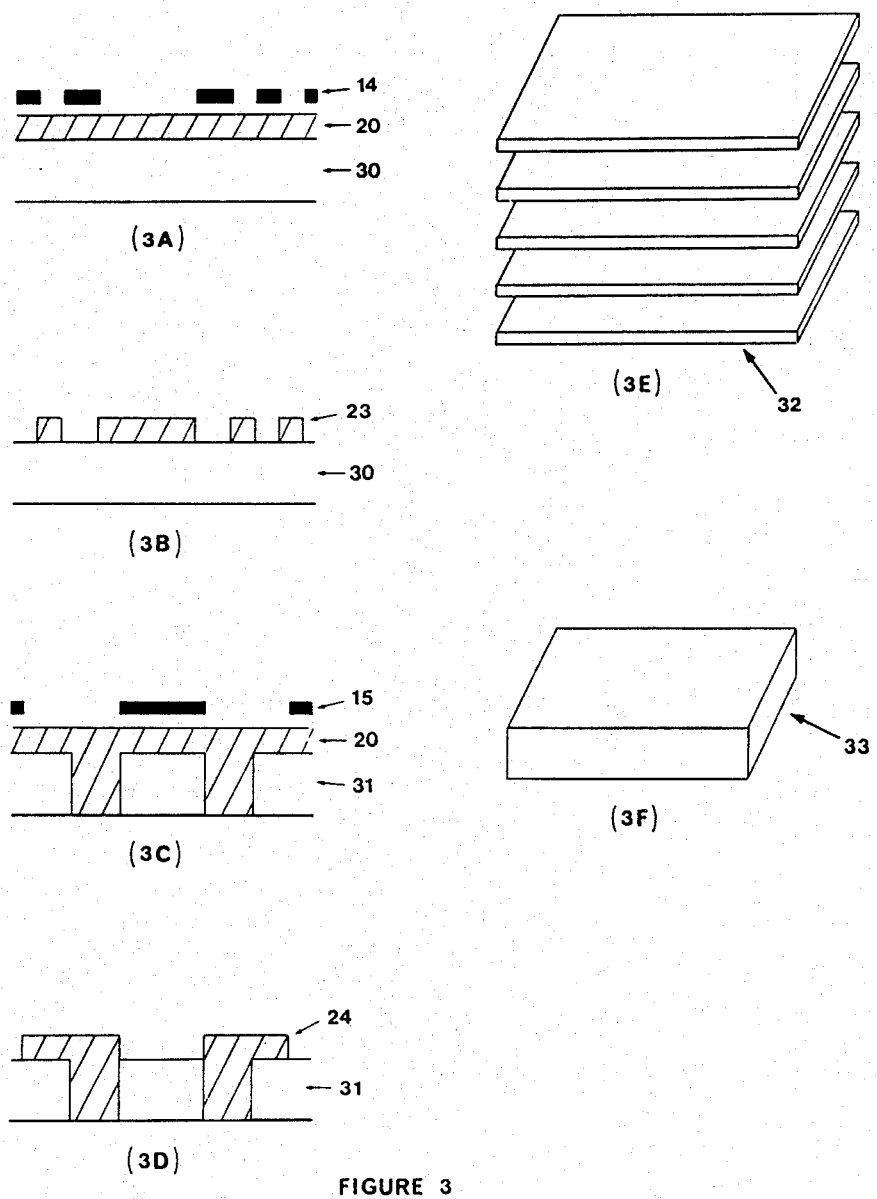
FIG. 3 is a schematic representation showing an alternative method of building a multi-pattern structure by lamination of separate supports.

FIG. 3 illustrates another alternative method of building a multipatterned structure. Multiple patterns are generated on separate sinterable supports. The separate supports are subsequently laminated and cofired to form a single multipatterned structure. Referring to FIG. 3A, a metal loaded photopolymer layer 20 is applied upon a sinterable layer 30 and imaged through the photomask 14. After developing, the resultant pattern 23 is shown in 3B. This patterning can be repeated as taught in the description of FIG. 2.

Referring to FIG. 3C, a metal loaded photopolymer 20 is applied to a sinterable support 31 which contains via holes for electrical interconnection to adjacent layers. (The via holes can be formed by conventional punching or by this photopolymer process.) The loaded photopolymer 20 is exposed through photomask 15 and developed as previously described to form patterned layer 24 as shown in FIG. 3D. This patterning can be repeated as taught in the description of FIG. 2.

Combinations of the patterned supports described in FIGS. 3B and 3D can then be positioned and laminated as shown in FIG. 3E. The bottom layer 32 can be one of the above layers or a differently prepared sinterable material. The laminated patterned supports are cofired to form a monolithic structure 33 as shown in FIG. 3F.

As an example of this embodiment, several of the patterned supports described in FIG. 1 are laminated under heat and pressure and cofired to create a monolithic structure.

As a further variation on this embodiment the support can be removable. Prior to the lamination step the supports can be removed and the various layers laminated together and then fired.

It is understood that the foregoing detailed description is given merely by way of illustration and that many variations may be made therein without departing from the spirit of this invention.

What is claimed is:

1. A method of making a structure of conductors and insulators having a distribution of electrical elements capable of exhibiting electrical interconnections comprising the steps of
   (a) applying on a substantially continuous sinterable support a layer of a composition comprising a sinterable material and a radiation sensitive material which serves as a binder for the sinterable material, said sinterable material being an insulator or a conductor;
   (b) exposing the layer to radiation in a desired pattern;
   (c) developing the composition layer by removing areas not forming the desired pattern; and
   (d) sintering the composite product in a single firing process whereby the substantially continuous support and layer shrink together to form a monolithic structure.

2. A method according to claim 1, wherein in step (a) the substantially continuous sinterable support is provided by coating a sinterable material and a radiation sensitive material on a removable support and uniformly exposing the materials to radiation.

3. The method according to claim 1, wherein the sinterable material is an insulator.

4. The method according to claim 1, wherein the sinterable material is a conductor.

5. The method according to claim 1, wherein the exposure in step (b) utilizes a photomask.

6. The method according to claim 1, wherein the exposure in step (b) utilizes scanned radiation.

7. A process according to claim 1, wherein a multipattern structure of conductors and insulators having an internal distribution of electrical elements capable of exhibiting multilayer electrical interconnections is produced, comprising
   (i) forming after the developing in step (c), at least one additional pattern by applying a layer of a composition comprising a sinterable material and a radiation sensitive material which serves as a binder for the sinterable material, said sinterable material being an insulator or a conductor, and repeating steps (b) and (c) to form a composite product; and
   (ii) conducting the single firing in the final sintering step (d) after forming the last pattern in step (i).

8. A process according to claim 2, wherein a multipattern structure of conductors and insulators having an internal distribution of electrical elements capable of exhibiting multilayer electrical interconnections is produced, comprising
   (i) forming after the developing in step (c), at least one additional pattern by applying a layer of a composition comprising a sinterable material and a radiation sensitive material which serves as a binder for the sinterable material, said sinterable material being an insulator or a conductor, and repeating steps (b) and (c) to form a composite product; and
   (ii) conducting the single firing in the final sintering step (d) after forming the last pattern in step (i).

9. A process according to claim 7, wherein the sinterable material is an insulator.

10. A process according to claim 7, wherein the sinterable material is a conductor.

11. The method according to claim 7, wherein the exposure in step (b) utilizes a photomask.

12. The method according to claim 7, wherein the exposure in step (b) utilizes scanned radiation.

13. A monolithic structure made by the process of claim 8 with a single firing.

14. A monolithic structure made by the process of claim 7 with a single firing.

15. A process according to claim 1, wherein a multipattern structure of conductors and insulators having an internal distribution of electrical elements such as conductor, inductor, resistor and capacitor elements capable of exhibiting multilayer electrical interconnections is produced, comprising
   (i) after the developing of the first pattern in step (c), forming at least one additional pattern by repeating steps (a)–(c) on a separate support;
   (ii) laminating together the various patterns to form a composite product; and
   (iii) conducting the single firing in the final sintering step (d) after forming the laminate in step (ii).

16. A process according to claim 15, wherein vias are made through the support.

17. A monolithic structure made by the process of claim 15 with a single firing.

* * * * *